(12) United States Patent
Kushnir et al.

(10) Patent No.: US 11,240,079 B1
(45) Date of Patent: Feb. 1, 2022

(54) SYSTEMS, METHODS, AND DEVICES FOR HIGH-SPEED DATA MODULATION

(71) Applicant: MELLANOX TECHNOLOGIES TLV LTD., Raanana (IL)

(72) Inventors: Igal Kushnir, Hod-Hasharon (IL); Eshel Gordon, Aloney Aba (IL); Roi Levi, Bruchin (IL)

(73) Assignee: MELLANOX TECHNOLOGIES TLV LTD., Raanana (IL)

( * ) Notice: Subject to any disclaimer, the term of this patent is extended or adjusted under 35 U.S.C. 154(b) by 0 days.

(21) Appl. No.: 17/183,775

(22) Filed: Feb. 24, 2021

(51) Int. Cl.
 *H04L 27/26* (2006.01)
 *H04L 5/00* (2006.01)

(52) U.S. Cl.
 CPC ........ *H04L 27/2602* (2013.01); *H04L 5/0044* (2013.01)

(58) Field of Classification Search
 CPC ... H04L 1/0041; H04L 27/2627; H04L 27/36; H04L 25/03343; H04L 27/04; H04L 27/2602; H04L 5/0044
 See application file for complete search history.

(56) References Cited

U.S. PATENT DOCUMENTS

| | | | | |
|---|---|---|---|---|
| 7,039,067 B2* | 5/2006 | Feinberg | ................ | H04J 3/1611 370/468 |
| 7,221,298 B1* | 5/2007 | Persons | ............. | G01R 31/3191 341/118 |
| 8,315,303 B1* | 11/2012 | Chana | ................ | H04L 25/4902 375/238 |
| 2002/0175704 A1* | 11/2002 | Young | .................... | H04J 3/047 326/46 |
| 2003/0016148 A1* | 1/2003 | Zhang | ................. | H03K 3/3562 341/101 |
| 2015/0139252 A1* | 5/2015 | Nguyen | .................. | H04J 3/047 370/516 |
| 2018/0350690 A1* | 12/2018 | Sekigawa | .......... | H03K 19/1737 |
| 2020/0295976 A1* | 9/2020 | Kobayashi | ........ | H04L 25/03343 |

* cited by examiner

*Primary Examiner* — Khanh C Tran
(74) *Attorney, Agent, or Firm* — Sheridan Ross P.C.

(57) ABSTRACT

A data modulator for a transmitter includes a multiplexer configured to receive, at a first rate, a first data stream including a plurality of first symbols and a second data stream including a plurality of second symbols. The multiplexer is configured to selectively output, based on a first clock signal, the plurality of first symbols and the plurality of second symbols to form a third data stream that achieves a second rate greater than the first rate for transmission of the third data stream by the transmitter.

20 Claims, 8 Drawing Sheets

SYSTEMS, METHODS, AND DEVICES FOR HIGH-SPEED DATA MODULATION

FIELD OF THE DISCLOSURE

The present disclosure is generally directed to systems, methods, and devices for high-speed data modulation.

BACKGROUND

Data transmission devices may include digital-to-analog converters (DACs) and data modulators to assist with converting digital data into analog data for transmission over a network. The type of DAC and/or data modulator used in a data transmission device is one factor that impacts performance (e.g., transmission rate capabilities, reliability of transmitted data, etc.) of the data transmission device.

BRIEF SUMMARY

In an illustrative embodiment, a data modulator for a transmitter includes a multiplexer configured to receive, at a first rate, a first data stream including a plurality of first symbols and a second data stream including a plurality of second symbols, and selectively output, based on a first clock signal, the plurality of first symbols and the plurality of second symbols to form a third data stream that achieves a second rate greater than the first rate for transmission of the third data stream by the transmitter.

In an illustrative embodiment, a digital to analog converter (DAC) includes a first amplifier block configured to receive a first bit and a second bit of a first data stream at a first rate and output first and second signals based on values of the first and second bits, a second amplifier block configured to receive a third bit and a fourth bit of a second data stream at the first rate and output third and fourth signals based on values of the third and fourth bits, a modulator configured to receive the first, second, third, and fourth signals, and selectively output, based on a first clock signal, symbols of the first, second, third, and fourth signals to form a third data stream having a second rate greater than the first rate, and a conversion circuit configured to receive the symbols of the third data stream and output an analog signal representative of the first data stream and the second data stream.

In an illustrative embodiment, a transmitter includes a parallel input serial output (PISO) device configured to receive parallel input data and output serialized data at a first rate, and a digital to analog (DAC) converter. The DAC includes a first amplifier block configured to receive first and second bits of a first data stream of the serialized data at the first rate and output first and second signals based on values of the first and second bits, a second amplifier block configured to receive third and fourth bits of a second data stream of the serialized data at the first rate and output third and fourth signals based on values of the third and fourth bits, a modulator configured to receive the first, second, third, and fourth signals, and to selectively output, based on a first clock signal, symbols of the first, second, third, and fourth signals to form a third data stream having a second rate greater than the first rate, and a conversion circuit configured to receive the symbols of the third data stream from the modulator and output an analog signal representative of the third data stream.

Additional features and advantages are described herein and will be apparent from the following description and the figures.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

It will be appreciated from the following description, and for reasons of computational efficiency, that the components of the system can be arranged at any appropriate location within a distributed network of components without impacting the operation of the system.

Furthermore, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a PCB, or the like.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C" "A, B, and/or C," and "A, B, or C" means A alone, B alone, C alone, A and B together, A and C together, B and C together, or A, B and C together.

The terms "determine," "calculate," and "compute," and variations thereof, as used herein, are used interchangeably and include any appropriate type of methodology, process, operation, or technique.

Various aspects of the present disclosure will be described herein with reference to drawings that may be schematic illustrations of idealized configurations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Where reference to general element or set of elements is appropriate instead of a specific element, the description may refer to the element or set of elements by its root term. For example, when reference to a specific element $X_1$, $X_2$, etc. is not necessary, the description may refer to the element(s) in general as "X."

The throughput of data center interconnects is getting higher, and therefore the components that handle the data are getting faster and more power hungry. The interconnection between devices, modules and systems is done via SerDes IPs that are used to transmit and receive the interconnect signals. To keep up with the market, there is a desire to design faster and lower power SerDes IPs.

Inventive concepts relate to an architecture of data modulator that can be used to design low power and high speed SerDes transmitter. The architecture is faster and consumes lower power than the current transmitter topologies that are used in SerDes systems.

Related art designs of SerDes IP transmitters have either data path speed or clock path speed or both toggling at the rates and speeds of the output data. Therefore, when increasing the rate of the output data, the clock and/or data path rates is also increased. This leads to a very challenging design which consumes high power and may be bandwidth limited. In high rate transmitter designs, like the 212.5 G SerDes, in which the output pulse width with is ~9.4 ps, related art topologies may fail to comply with industry regulations.

Accordingly, inventive concepts relate to a SerDes transmitter (TX) that uses a K-input data modulator (KDM). In operation, data is generated in the digital domain and passed over a low rate parallel bus to a parallel to serial block which serializes the data up to a quarter rate (or other desired rate) of the final rate. Furthermore, the data is arranged in a specific manner that suits the KDM DAC. A clocking system is fed by a TX phase locked loop and generates the high-rate clocks (e.g., quarter rate) for a 2:1 MUX and a KDM driver. An additional low-rate block is used to generate the clocks for the parallel to serial block.

In general, example embodiments utilize a specific data arrangement at the input to the KDM, data and clock multiplexing at the last stage (output of the DAC) that allows full rate signal generation over a passive device, and specific hardware that eliminates the need for full rate signals through active devices. The KDM can be implemented in voltage mode or in a current mode implementation. In order to produce the wanted output signal without using high-rate data path or clock chains, there is a use of a specific data and clock arrangement and hardware. Notably, the wanted, high speed, signal is generated at the output of the transmitter over a passive load, thereby reducing power consumption.

A transmitter according to example embodiments uses an ultra-high-speed and low power data modulator that can be implemented in a SerDes system (examples: 200 G PAM4/ 6/8 or USR NRZ/PAM4). Notably, there is no active device in the transmitter that operates at the full rate of output data. Rather, there is a specific combination and timing of low-rate data and clock multiplexing that generate the full rate data signal at the output of the KDM over a passive device.

Figure 1:
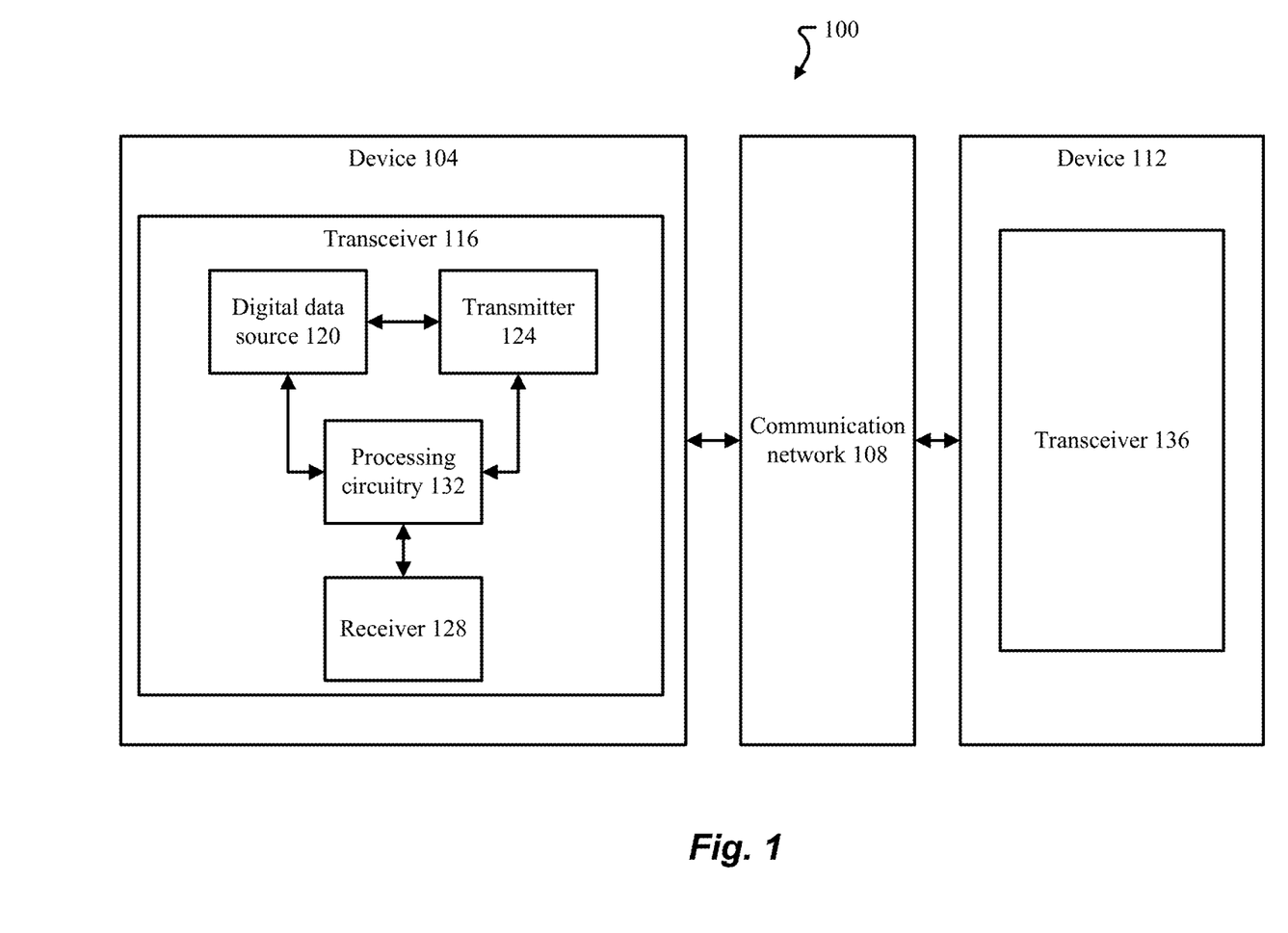
FIG. 1 illustrates a system according to at least one example embodiment.

FIG. 1 illustrates an optical system 100 according to at least one example embodiment. The optical system 100 includes a device 104, a communication network 108, and a device 112. In at least one example embodiment, devices 104 and 112 correspond to one or more of a Personal Computer (PC), a laptop, a tablet, a smartphone, a server, a collection of servers, or the like. In some embodiments, the devices 104 and 112 may correspond to any appropriate type of device that communicates with other devices also connected to a common type of communication network 108. As another specific but non-limiting example, the devices 104 and 112 may correspond to servers offering information resources, services and/or applications to user devices, client devices, or other hosts in the system 100.

Examples of the communication network 108 that may be used to connect the devices 104 and 112 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific, but non-limiting example, the communication network 108 is a network that enables data transmission between the devices 104 and 112 using optical signals. In this case, the devices 104 and 112 and the communication network 108 may include waveguides (e.g., optical fibers) that carry the optical signals.

The device 104 includes a transceiver 116 for sending and receiving signals, for example, data signals. The data signals may be optical signals modulated with data or other suitable signal for carrying data.

The transceiver 116 may include a digital data source 120, a transmitter 124, a receiver 128, and processing circuitry 132 that controls the transceiver 116. The digital data generator 120 may include suitable hardware and/or software for outputting data in a digital format (e.g., in binary format). The digital data output by the digital data source 120 may be retrieved from memory (not illustrated) or generated according to input (e.g., user input).

The transmitter 124 includes suitable software and/or hardware for receiving digital data from the digital data source 120 and outputting data signals according to the digital data for transmission of the data signals over the communication network 108 to device 112. Additional details of the structure of the transmitter 124 are discussed in more detail below with reference to the figures.

The receiver 128 may include suitable hardware and/or software for receiving signals, for example, data signals from the communication network 108. For example, the receiver 128 may include a photodetector for detecting optical signals and/or a demodulator for demodulating received data signals to extract the data for storing in a memory.

The processing circuitry 132 may comprise software, hardware, or a combination thereof for controlling the transceiver 116. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 132 may comprise hardware, such as an application specific integrated circuit (ASIC). Other non-limiting examples of the processing circuitry 132 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. It should be appreciated that any appropriate type of electrical component or collection of electrical components may be suitable for inclusion in the processing circuitry 132. The processing circuitry 132 may send and/or receive signals to and/or from other elements of the transceiver 116 to control overall operation of the transceiver 116.

The transceiver 116 or selected elements of the transceiver 116 may take the form of a pluggable card or controller for the device 104. For example, the transceiver 116 or selected elements of the transceiver 116 may be implemented on a network interface card (NIC).

The device 112 may include a transceiver 136 for sending and receiving signals, for example, data signals over the communication network 108. The same or similar structure of the transceiver 116 may be applied to transceiver 136, and thus, the structure of transceiver 136 is not described separately.

Although not explicitly shown, it should be appreciated that devices 104 and 112 and the transceivers 116 and 120 may include other processing devices, storage devices, and/or communication interfaces generally associated with computing tasks, such as sending and receiving data over a wired and/or wireless connection.

Figure 2:
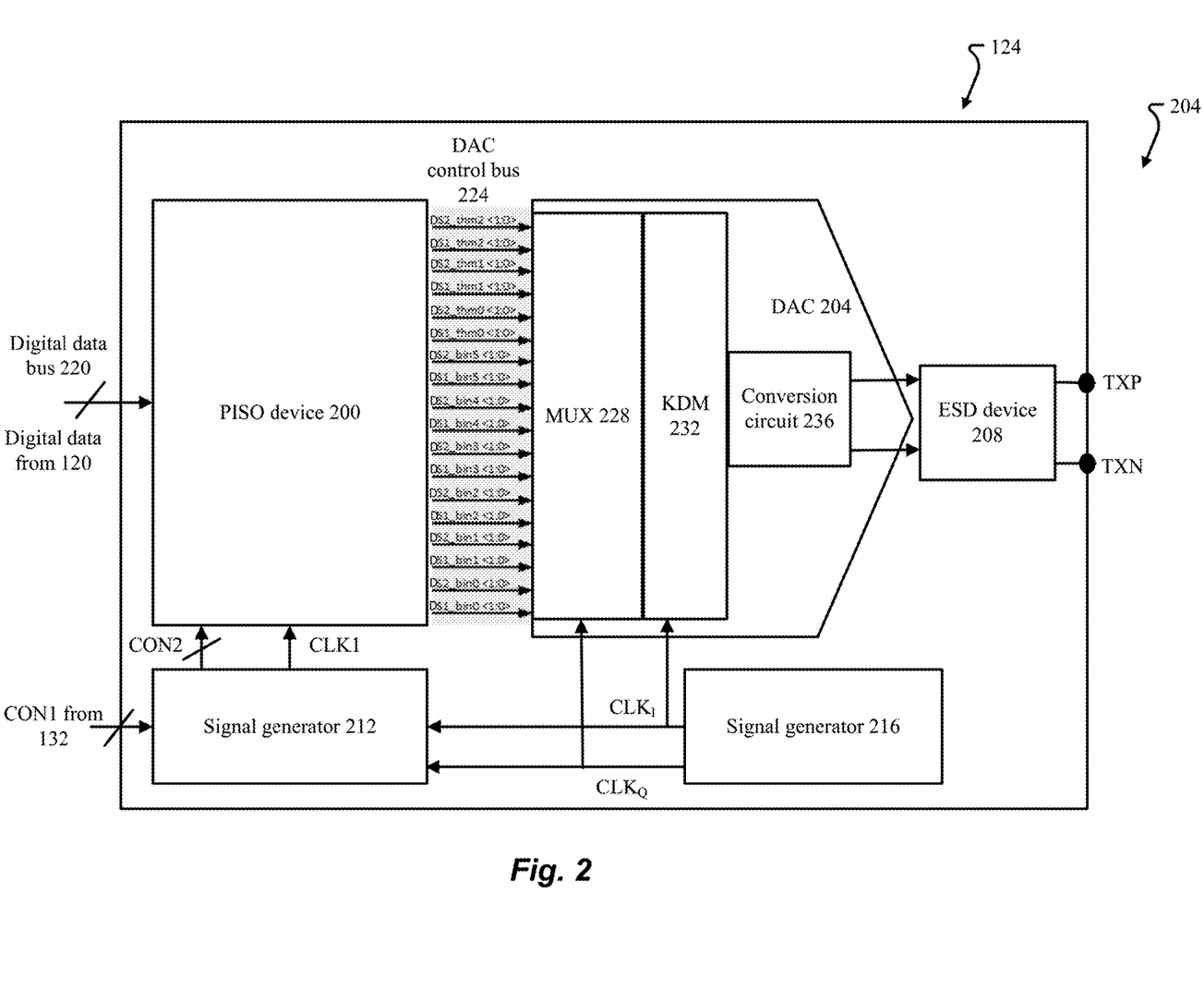
FIG. 2 illustrates additional details of the transmitter in FIG. 1 according to at least one example embodiment.

FIG. 2 illustrates additional details of the transmitter 124 in FIG. 1 according to at least one example embodiment.

The transmitter 124 includes a parallel input serial output (PISO) device 200, a DAC 204, an electrostatic (ESD) device 208, and signal generators 212 and 216. The PISO device 200 includes suitable components (e.g., switches) for serializing the parallel input data to output serialized data. That is, the PISO device 200 is configured to output digital serialized data based on digital parallel input data. The digital parallel input data may be received by the PISO device 200 over a digital data bus 220 from digital data source 120.

Figure 5:
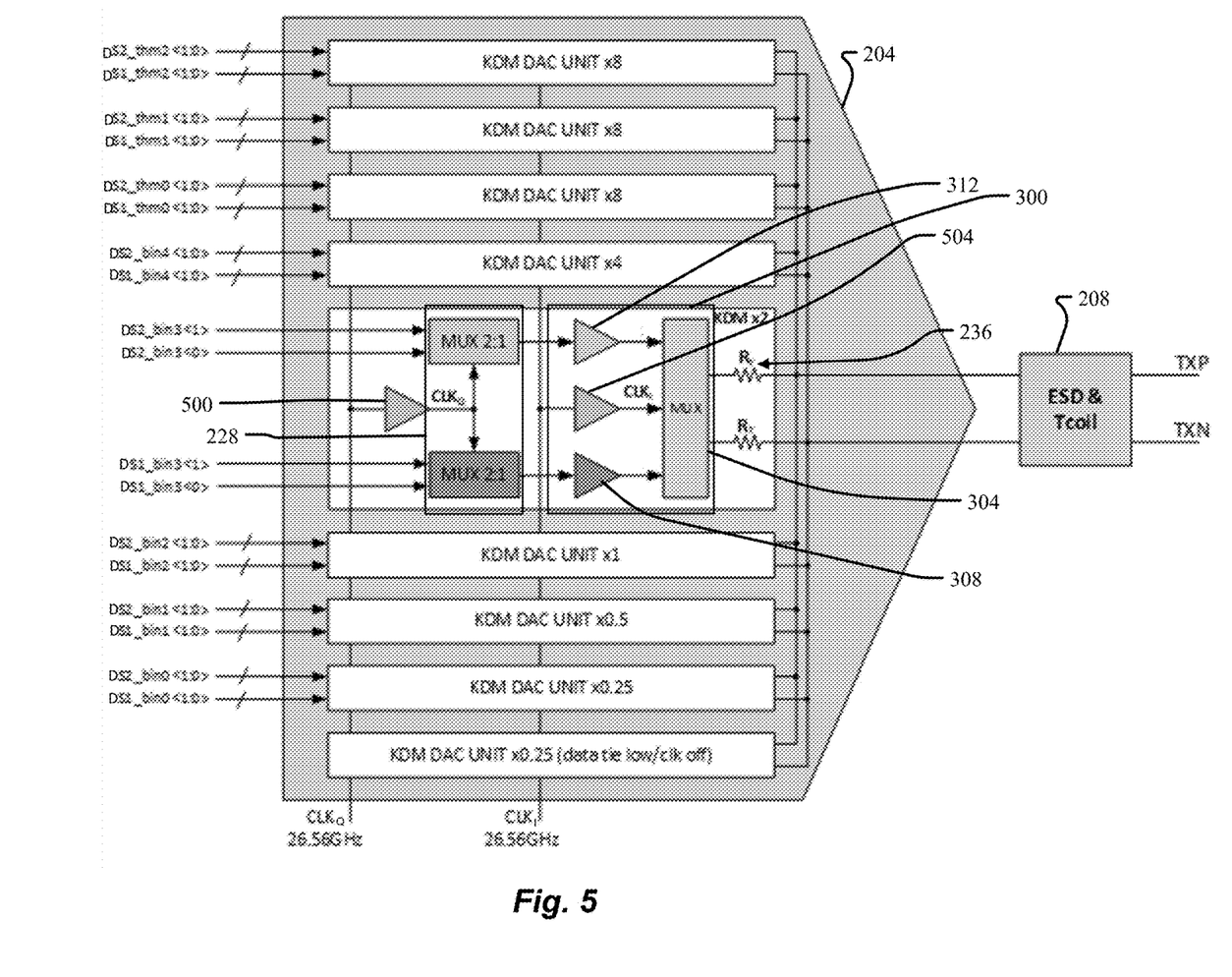
FIG. 5 illustrates the DAC from FIG. 2 in additional detail according to at least one example embodiment.

The DAC 204 receives the serialized digital data from the PISO device 200 over a DAC control bus 224. As shown, the serialized digital data sent over the DAC control bus 224 may include a plurality of data streams DS1 and DS2, where some of bits of the data streams are binary encoded (i.e., streams labeled bin0 to bin5) while some bits of the data streams are unary or thermometer encoded (i.e., streams labeled thm0 to thm2). FIG. 5 also illustrates at least some of these streams. The notation in FIG. 2 of the serialized data sent over control bus 224 indicates a position of a bit in a data block and whether the bit part of a binary code of the data block or a thermometer code of the data block. For example, for a data block of a first data stream DS1 and a data block of a second data stream DS2, bin0 to bin5 indicate first through fifth less significant bits of the data block with bin0 being the least significant bit (LSB) of the data block and thm0 to thm2 are more significant bits of the data block with thm2 being the most significant bit (MSB) of the data block. The notation <1:0> for each data path of the bus 224 indicates that each arrow represents two data lines for carrying differential data with each input bit being represented by a differential signal having "positive" and "negative" portions, where each portion is input to an input of the DAC 204. Although the DAC 204 is shown and described as including differential inputs and a differential output, it should be appreciated that the input and output of the DAC 204 may single-ended if desired.

Although FIG. 2 illustrates a data block with a combination of binary encoded bits (bin) and thermometer encoded bits (thm), it should be appreciated that the data black may comprise all binary encoded bits, all thermometer encoded bits, some or all bits encoded by another encoding process, or any combination thereof.

The DAC 204 converts the serialized digital data into an analog signal which corresponds to a data signal for transmission over the communication network 108. To further this end, the DAC 204 may include a multiplexer (MUX) 228 for multiplexing streams of digital data from the PISO device 200 so that symbols in the streams are in a specific order, which allows the DAC 204 to upconvert (e.g., passively upconvert) the rate of the data received from the PISO device 200 to a final rate that is ready for transmission. To assist with achieving this result, the DAC 204 includes a k-input data modulator (KDM) 232, which operates to step-up the data rate as a result of a specific arrangement of symbols output from the MUX 228 and manipulation of the timing for sampling of the symbols using clock signals (or clocks). Throughout the instant description, a symbol is a signal representative of one or more bits of digital data with the number of bits being represented in a single symbol depending on the modulation scheme (e.g., PAM4, PAM6, PAM8, etc.). The DAC 204 further includes a conversion circuit 236 which converts the modulated data signals from the KDM 232 to an analog signal for output to the ESD device 208. Additional details of the DAC 204 are discussed in more detail below with reference to FIGS. 3A-5.

The ESD device 208 is coupled to the output of the DAC 204 and a node (or nodes) that is configured to be connected to a load (e.g., a transmission line). For example, the ESD device is coupled between the output of the DAC 204 and differential output nodes or pins TXP and TXN. The ESD device 208 may include suitable circuitry for reducing or eliminating electrostatic shock at the differential output nodes or pins TXP and TXN of the transmitter 124. In at least one example embodiment, the ESD device 208 comprises inductors and at least one capacitor in a T-coil configuration.

The signal generator 212 includes suitable components for receiving control signals CON1 from processing circuitry 132 and generating controls signals CON2 and a clock signal CLK1 for the PISO device 200. The control signals CON2 and/or the clock signal CLK1 may be generated by the signal generator 212 based on control signals CON1. The clock signal CLK1 may control the rate at which the digital data input to the PISO device 200 is serialized. Control signals CON1 and/or CON2 may include set/reset signals, enable/disable signals, frequency setting signals for setting a frequency of CLK1 (e.g., a programmable divider that receives CLKI and/or CLKQ to generate CLK1), signals to adjust the speed of data received over bus 224, and/or other adjustment signals (e.g., signals to adjust one or more of the clock signals).

The signal generator 216 includes suitable components for generating a clock signal CLK1 for the KDM 232 and a clock signal $CLK_Q$ for the MUX 228. In at least one example embodiment, the signal generator 216 includes phase locked loop (PLL) circuitry that generates the clock signals $CLK_I$ and $CLK_Q$ at desired frequencies. The KDM 232 may use the clock signal $CLK_I$ to control the rate of digital-to-analog conversion while the MUX 228 uses the clock signal $CLK_Q$ to control the arrangement of symbols in a data stream via switching of the MUX 228.

The frequencies of clock signals CLK1, $CLK_I$, and $CLK_Q$ are a design parameter set based on empirical evidence and/or preference. For example, the frequencies of the clock signals CLK1, $CLK_I$, and/or $CLK_Q$ may be set based on a speed at which digital data is received from digital data source 120 and/or on a speed at which the data is desired to be transmitted from the transmitter 124. In at least one example embodiment, the frequency of the first clock signal CLK1 is less than the frequencies of the clock signals $CLK_I$ and $CLK_Q$. The signal generator 212 may receive the clock signals $CLK_I$ and $CLK_Q$ and use the clock signals $CLK_I$ and $CLK_Q$ to adjust a frequency of the clock signal CLK1 so that the PISO device 200 is properly synchronized with the DAC 204 and MUX 228.

Figure 3A:
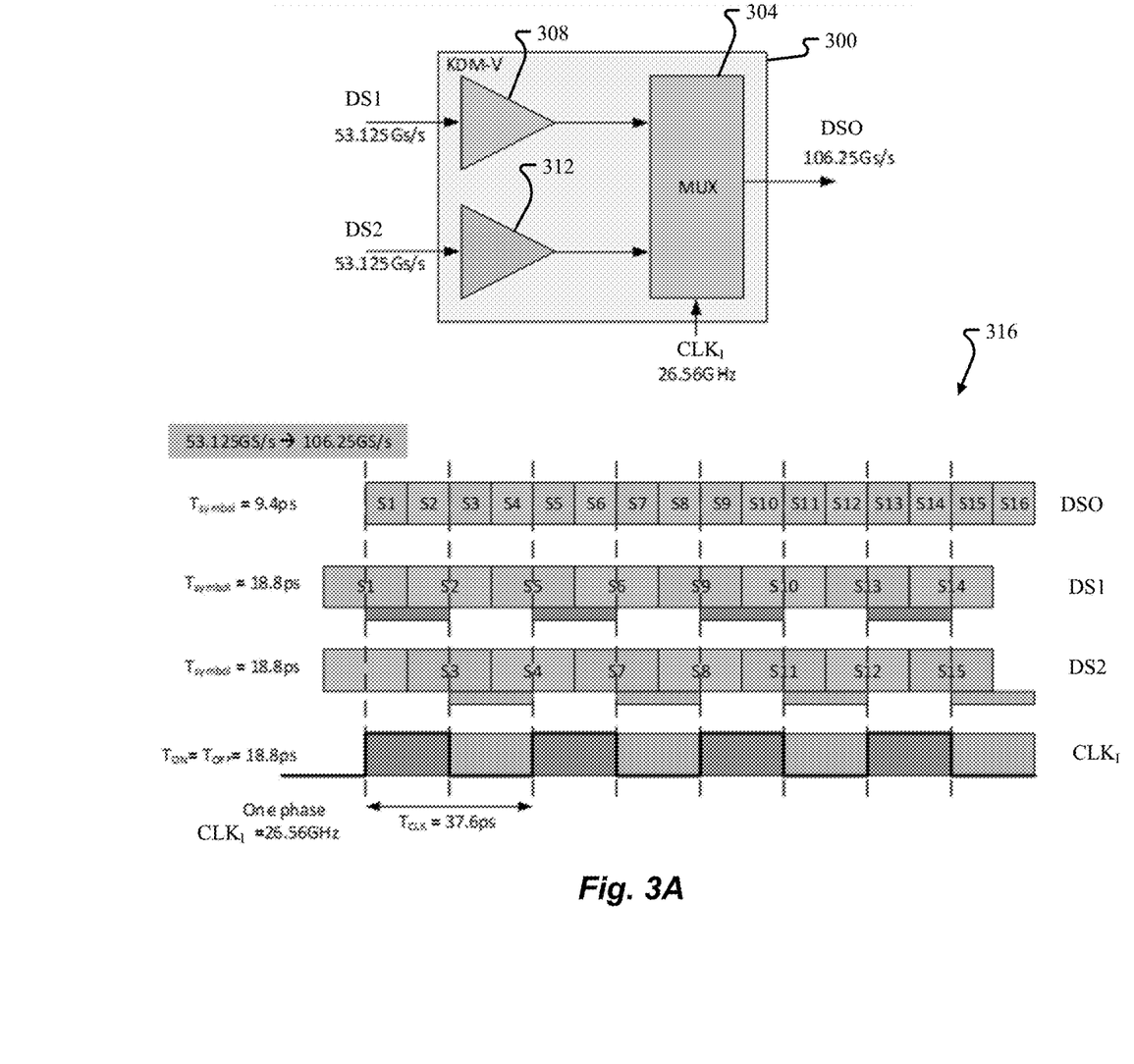
FIG. 3A illustrates a general schematic representation of a two-input data modulator implemented with voltage control as well as a timing diagram according to at least one example embodiment.

FIG. 3A illustrates a general schematic representation of a K-input data modulator KDM 300 implemented with voltage control (also referred to as a KDM-V 300) as well as a timing diagram 316 for controlling the KDM-V 300. The KDM-V 300 may correspond to KDM 232 in the DAC 204 to modulate the data from MUX 228 as part of the digital-to-analog conversion process. In the example of FIG. 3A, the KDM-V 300 is a two-input modulator that receives two data streams DS1 and DS2. The KDM-V 300 includes a MUX 304, and amplifier blocks 308 and 312 that receive bits of data in data streams DS1 and DS2, respectively, from the MUX 228. The amplifiers blocks 308 and 312 may receive digital bits of respective data streams DS1 and DS2 and output symbols based on values of the received digital bits. In the example of FIG. 3A, data streams DS1 and DS2 comprise symbols S1 to S16 that are output from the MUX 304 as output data in sequential order from symbol S1 to symbol S16. As described in more detail below, symbols of the data streams DS1 and DS2 are specifically sequenced prior to input to the KDM-V 300 and sampled according to special timing to achieve sequential ordering at the output with a higher rate compared to the input symbols.

As evidenced by the timing diagram 316, the principle of the KDM-V 300 is that the output data (or output symbols) are generated using data toggling and clock toggling, which means that data streams DS1 and DS2 are output (toggled) in the middle of the clock $CLK_I$ for the MUX 304 (i.e., a stable period of the clock signal), while the clock $CLK_I$ is toggled in the middle of the data streams S1 and S2. Thus, each time that the clock $CLK_I$ toggles and selects a different input of the MUX 304, two output symbols are generated. That is, aside from the first rising edge of $CLK_I$ in FIG. 3A, the KDM-V 300 enables two symbols to be output from the MUX 304 on each falling edge and each rising edge of the clock $CLK_I$. As shown in the timing diagram 216, the effect of this scheme is that the rate of each data stream DS1 and DS2 input to the KDM-V 300 is doubled to achieve the final desired rate for transmission. In the example of FIG. 3A, the initial rate of each data stream DS1 and DS2 is 53.12 Gs/s while the rate output from the MUX 304 is 106.25 Gs/s. Here, the rates correspond to sampling rates, which translate to bit rates for transmission of data after digital-to-analog conversion of the symbols.

As can be appreciated, example embodiments employ a specific data arrangement of data streams DS1 and DS2 to ensure proper order of the output symbols. For example, data stream DS1 includes symbols S1, S2, S5, S6, S9, S10, S13, and S14, while data stream DS2 includes symbols S3, S4, S7, S8, S11, S12, and S15. The specific arrangement of symbols may be accomplished by controlling the PISO device 200 and/or the digital data source 120 such that, upon entering the MUX 228, data stream DS1 includes the first two symbols S1 and S2 (and the other illustrated symbols) in the output data while the next data stream DS2 includes two symbols S3 and S4 (and the other illustrated symbols) in the output data. The next symbol that occurs after two sequential symbols in each data stream depends on the number of data streams received by the KDM-V 300. In at least one example embodiment, the next symbol to occur after two sequential symbols in a data stream is equal to the twice the number of data streams input to the modulator subtracted by one. Thus, in FIG. 3A, number of data streams received by KDM-V 300 is two, so data stream DS1 is arranged such that symbol S5 occurs after sequential symbols S1 and S2 (i.e., (2 input streams×2=4−1=symbol S5 as the next symbol to occur after S2 in DS1). The same data arrangement may be true for data stream DS2 in FIG. 3A and may further hold true for other numbers of data streams (see FIG. 3B, for example).

As illustrated by FIG. 3A, the MUX 304 is configured to receive, at a first rate, the first data stream DS1 (having passed through the amplifier block 308) including a plurality of first symbols S1, S2, S5, S6, S9, S10, S13, and S14. The first rate in FIG. 3A corresponds to 53.125 Gs/s. The MUX 304 is further configured to receive a second data stream DS2 (having passed through the amplifier block 312) including a plurality of second symbols S3, S4, S7, S8, S11, S12, and S15. The MUX 304 is configured to selectively output, based on a first clock signal CLK1, the plurality of first symbols and the plurality of second symbols to form a third data stream of output data DSO that achieves a second rate greater than the first rate for transmission of the third data stream DSO by the transmitter. The second rate in FIG. 3A corresponds to 106.25 Gs/s. Thus, the second rate is at least twice the first rate. In this example, the frequency of the clock signal $CLK_I$ is 26.26 GHz (or one quarter the rate of the third data stream DSO, or half the rate of the first and second data streams DS1 and DS2).

As shown in the timing diagram 316, each symbol in the plurality of first symbols and each symbol in the plurality of second symbols spans a first amount of time Tsymbol (18.8 ps in this example), while a period of the first clock signal $CLK_I$ spans a second amount of time greater than the first time period. In FIG. 3A, the second amount of time corresponds to 37.6 ps. Thus, the second amount of time is twice as long as the first amount of time.

Still with reference to timing diagram 316, the MUX 304 is configured to output a first subset of the plurality of first symbols during a first half of a period of the first clock signal $CLK_I$, and output a second subset of the plurality of second symbols during a second half of the period of the first clock signal $CLK_f$. For example, for the first (leftmost) period of the clock signal $CLK_f$, the first subset of the plurality of first symbols includes first and second symbols S1 and S2, and the second subset of the plurality of second symbols includes third and fourth symbols S3 and S4. As shown, the first, second, third, and fourth symbols S1 to S4 are arranged sequentially in that order in the third data stream DSO output from the MUX 304. In the example of FIG. 3A (and FIG. 3B) multiplexer 304 is implemented with voltage control. However, example embodiments are not limited thereto and the multiplexer 304 may be implemented with current control (see FIGS. 6A and 6B). In this case, the same timing may be implemented for a current control embodiment. In FIG. 3A, it should be appreciated that the length of each symbol input to the KDM-V 300 is reduced by half from 18.8 ps to 9.4 ps in order to achieve the greater rate of 106.25 Gs/s. In at least one example embodiment, at least one of the first data stream and the second data stream is thermometer encoded (see the thm streams in FIG. 2).

Figure 3B:
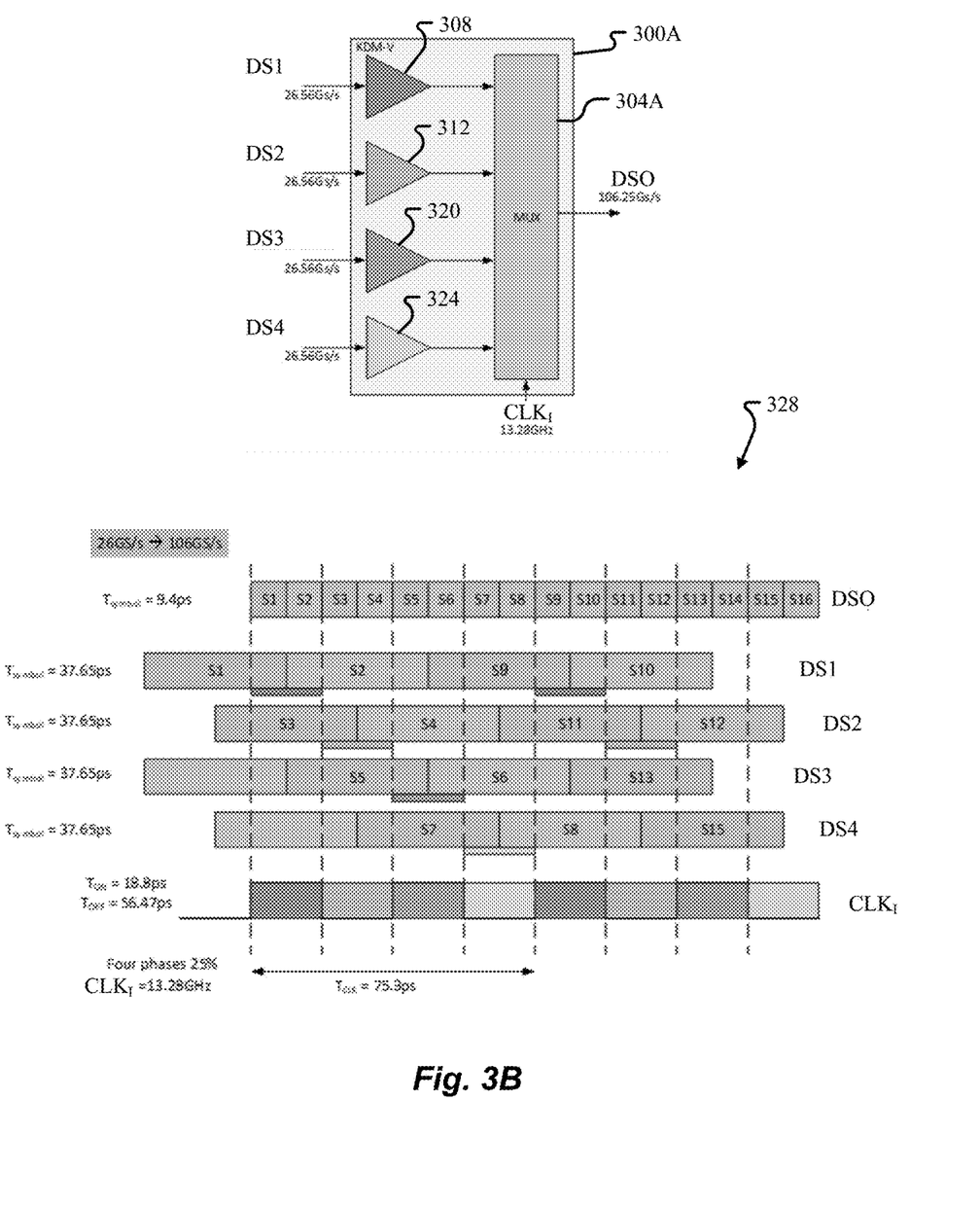
FIG. 3B illustrates a general schematic representation of a four-input data modulator implemented with voltage control as well as a timing diagram according to at least one example embodiment.

FIG. 3B illustrates a general schematic representation of a K-input data modulator KDM 300A implemented with voltage control (also referred to as a KDM-V 300A) as well as a timing diagram 328 for controlling the KDM-V 300A. FIG. 3B is similar to FIG. 3A except that the KDM-V 300A has four inputs to receive four data streams DS1 to DS4. The four data streams DS1 to DS4 are quarter rate streams received by the KDM-V 300A at 26.56 Gs/s while the clock signal $CLK_f$ has a frequency of 13.28 GHz and a 25% duty cycle for each stream to allow each stream to output two symbols per period of the clock signal $CLK_f$. Like in FIG. 3A, symbols in the data streams DS1 to DS4 have a specific arrangement so that two consecutive symbols in each stream are output from the MUX 304A during one of the four phases of the clock signal $CLK_f$ (illustrated by the thin bars under symbols S1 and S2, S3 and S4, S5, and S6, and so on). In FIG. 3B a period of the clock signal $CLK_f$ is 75.3 ps, and a length of each input symbol is 37.65 ps which is shortened to 9.4 ps in the output stream DSO to achieve a rate of 106.25 Gs/s at the output of the MUX 304A. As in FIG. 3A, the clock signal $CLK_f$ is half the rate of the input data streams DS1 to DS4 (13.28 GHz vs. 26.56 Gs/s).

Figure 4:
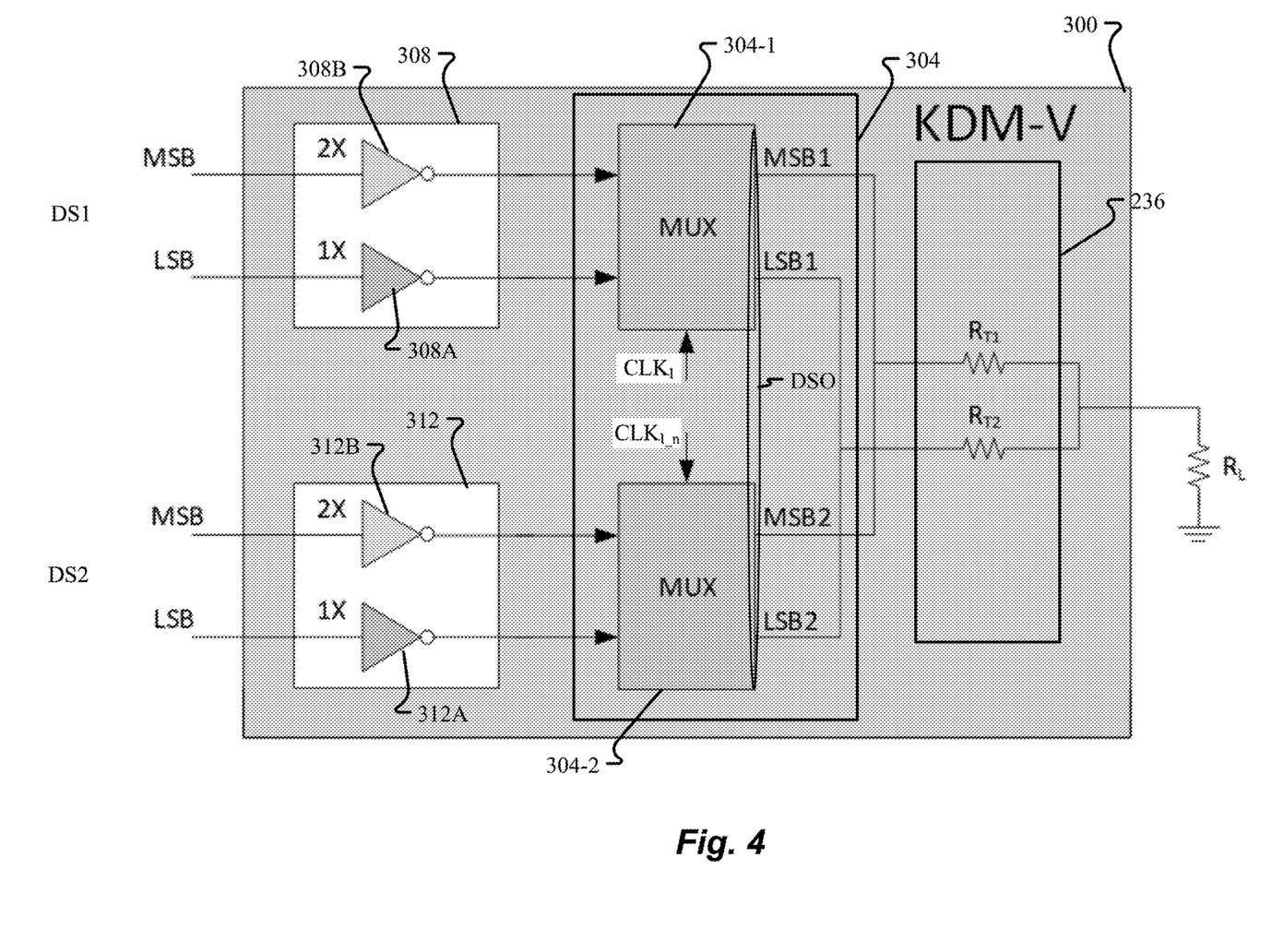
FIG. 4 illustrates the data modulator from FIG. 3A in additional detail according to at least one example embodiment.

FIG. 4 illustrates the KDM-V 300 in FIG. 3A in additional detail according to at least one example embodiment. The KDM-V 300 is a two-bit series-source termination (SST) voltage mode DAC. A DAC implementing the KDM-V 300 may be a single-ended output DAC or a differential output DAC (as in FIG. 2). FIG. 4 illustrates an example of a KDM-V for a single-ended output DAC. However, as should be appreciated, the KDM-V 300 may be modified to process and output differential signals. In this case, the components in the structure shown in FIG. 4 may be repeated or duplicated to enable receipt of differential signals in data streams DS1 and DS2 and output a differential analog signal. Such modification is within the ability of one having ordinary skill in the art.

As shown in FIG. 4, the KDM-V 300 includes a first amplifier block 308 configured to receive a first bit and a second bit (LSB and MSB) of a two-bit data block of a first data stream DS1 at a first rate and output first and second signals based on values of the first and second bits. The KDM-V 300 further includes a second amplifier block 312 configured to receive a third bit and a fourth bit (LSB and MSB) of a two-bit data block of a second data stream DS2 at the first rate and output third and fourth signals based on values of the third and fourth bits.

In the example of FIG. 4, the first amplifier block 308 includes a first amplifier 308A configured to receive the first bit and output the first signal, and a second amplifier 308B configured to receive the second bit and output the second signal. Additionally, the second amplifier block includes a third amplifier 312A configured to receive the third bit and output the third signal, and a fourth amplifier 312B configured to receive the fourth bit and output the fourth signal. In FIG. 4, the first bit (LSB) is a less significant bit than the second bit (MSB) in the first data stream DS1, and the third bit (LSB) is a less significant bit than the fourth bit (MSB) in the second data stream DS2. As indicated with 1× and 2× notations, gains of the second and fourth amplifiers 308A and 312A are at least double gains of the first and third amplifiers 308B and 312B in order to ensure proper signal strength for digital-to-analog conversion.

FIG. 4 further illustrates a modulator 304 configured to receive the first, second, third, and fourth signals, and selectively output, based on a first clock signal, symbols of the first, second, third, and fourth signals to form a third data stream DSO having a second rate greater than the first rate (see timing diagram 316 in FIG. 3). The modulator 304 includes a first multiplexer block 304-1 configured to receive the first and second signals and output symbols of the first and second signals according to the first clock signal $CLK_f$. The modulator 304 further includes a second multiplexer block 304-2 configured to receive the third and fourth signals and output symbols of the third and fourth signals according to an inverse of the first clock signal $CLK_{f\_n}$.

As further shown, the first multiplexer block 304-1 includes a first output MSB1 configured to output symbols of the first signal, and a second output LSB1 configured to output symbols of the second signal. The second multiplexer block 304-2 includes a first output MSB2 configured to output symbols of the third signal, and a second output LSB2 configured to output symbols of the fourth signal. The first output MSB1 of the first multiplexer block 304-1 is connected to the first output MSB2 of the second multiplexer block 304-2, and the second output LSB1 of the first multiplexer block 304-1 is connected to the second output LSB2 of the second multiplexer block 304-2.

FIG. 4 further illustrates a conversion circuit 400 configured to receive the symbols of the third data stream DSO and output an analog signal representative of the first data stream DS1 and the second data stream DS2. In this case, the third data stream DSO is formed by the combination of outputs LSB1, MSB2, LSB2, and MSB2. The conversion circuit 400 includes a voltage divider circuit connected to the first and second outputs of both of the first and second multiplexer blocks. The voltage divider circuit is represented in FIG. 4 with resistances RT1, RT2, and load resistance RL. The values of these resistances are design parameters set based on empirical evidence and/or preference, and may be weighted differently.

As noted above, FIG. 4 illustrates the KDM-V 300 from FIG. 3A in more detail. However, the same details apply to the KDM-V 300A in FIG. 3B except the number of amplifier blocks and multiplexer blocks are doubled to account for the two additional data streams DS3 and DS4. The outputs of the two additional multiplexer blocks are connected to the outputs of multiplexer locks 304-1 and 304-2 in the same manner as that shown in FIG. 4 (i.e., MSB1, MSB2, and unillustrated outputs MSB3 and MSB4 are connected together, and LSB1, LSB2, and unillustrated outputs LSB3 and LSB4 are connected together).

FIG. 5 illustrates the DAC 204 from FIG. 2 in additional detail according to at least one example embodiment. However, the DAC 204 in FIG. 5 is a 7-bit DAC, and thus does not include inputs to receive data bin5<1:0> from FIG. 2. The DAC 204 is a 7-bit DAC in that bin0 to bin4 represent first through fifth bits of a data block, thm0 represents a sixth bit of the data block that is twice as significant as bit bin4, and the combination of thm1 and thm2 represent a seventh bit of the data block that is twice as significant as bit thm0. In at least one example embodiment, bits for thm1 and thm2 are processed together to form the seventh bit of the data block. The inclusion of thermometer coded bits thm0, thm1, and thm2 with binary encoded bits bin0 to bin4 in a data block may assist with mitigating mismatch between DAC units since, as shown in FIG. 5, each DAC unit that receives binary encoded bits is scaled-up by double for each next most significant bit. Using thermometer encoded bits as the most significant bits in the data block means that additional scaling-up may be avoided for DAC units that receive bits thm0, thm1, and thm2, thereby reducing component mismatch between DAC units (e.g., amplifier and/or resistor mismatch).

As shown in FIG. 5, the DAC 204 includes a plurality of KDM DAC units. As shown for data streams with bits in position bin3, each DAC unit may include the multiplexer 228 from FIG. 2 and the KDM-V 300 from FIG. 3. As further shown, multiplexer 228 is a 2:1 multiplexer that outputs a bit for each stream DS1 and DS2 to respective amplifier blocks 308 and 312. From there, the KDM-V 300 and the conversion circuit 236 (including both resistances RT) operate as described above to output analog signal at an increased speed compared to the speed of the data input to the DAC 204. Here, it should be appreciated that FIG. 5 illustrates a simplified version of KDM DAC unit that receives bit bin3. In practice and as mentioned above with reference to FIG. 4, each KDM DAC unit may be modified in accordance with the knowledge of one of ordinary skill in the art to process and output differential signals or single-ended signals.

FIG. 5 further illustrates the inclusion of inverter blocks 500 and 504 to provide an inverted version of respective clock signals $CLK_Q$ and $CLK_I$ to one side of a respective MUX 228 and 304.

Each KDM DAC unit in FIG. 5 includes a designation ×0.25, ×0.5, ×1, ×2, ×4, and ×8. These designations are indicative of the values of gains of the amplifiers in the amplifier blocks and resistors in the conversion circuit 236 in KDM DAC unit relative to base values for gains of the amplifiers and base values for the resistors. That is, each designation indicates a weight that is applied to the amplifiers and resistors in a particular KDM DAC unit. The weights may be applied in an inversely proportional manner for the gain values of the amplifiers and the resistance values of the resistors. For example, KDM DAC unit ×1 means that values of gains for the amplifiers in the respective KDM-V 300 and values of the resistors in the respective conversion circuit 236 are equal to a given base gain and a given base resistance value, while KDM DAC unit ×2 means that values of gains are double that of the base gain and values of resistances are halved compared to the base resistance value. Meanwhile, KDM DAC ×0.5 means that values of gains are half of the base gain and values of the resistances are double the base resistance value, and KDM DAC ×4 means that values of gains are four times the base gain value and values of the resistances are one-quarter the base resistance value. Similar logic applies for the remaining KDM DAC units. The weighting may be accomplished by adjusting gain and resistance values within each KDM-V 300 and/or by placing one or more additional KDM-Vs 300 in parallel. These weights are for ensuring that each input bit has the proper effect on the eventual analog signal. As noted above, the scaling for DAC units that receive bits thm0, thm1, and thm2 remains at ×8 (instead of ×16 and ×32) because these bits are thermometer encoded instead of binary encoded.

In view of FIGS. 1-5, example embodiments provide a transmitter 124 including a PISO device 200 configured to receive parallel input data and output serialized data at a first rate. The transmitter 124 further includes a DAC 204. The DAC includes a first amplifier block 308 configured to receive first and second bits of a first data stream of the serialized data at the first rate and output first and second signals based on values (e.g., binary values) of the first and second bits. The DAC includes a second amplifier block 312 configured to receive third and fourth bits of a second data stream of the serialized data at the first rate and output third and fourth signals based on values (e.g., binary values) of the third and fourth bits. The first, second, third, and fourth bits of data may be input to the first and second amplifier blocks according to a predetermined arrangement (see FIGS. 3A and 3B). The DAC includes a multiplexer 304 configured to receive the first, second, third, and fourth signals, and to selectively output, based on a first clock signal, symbols of the first, second, third, and fourth signals to form a third data stream DSO having a second rate greater than the first rate. The DAC further includes a conversion circuit configured to receive the symbols of the third data stream from the modulator and output an analog signal representative of the third data stream. The second rate may be twice the first rate. The transmitter 124 may further include a first signal generator 216 configured to apply the first clock signal to the multiplexer, and a second signal generator 212 configured to apply a second clock signal to the PISO device 200.

Example embodiments have been discussed with respect to a KDM that is implemented with voltage control. However, example embodiments are not limited thereto, and the KDM may be implemented with current control as discussed in more detail below.

Figure 6A:
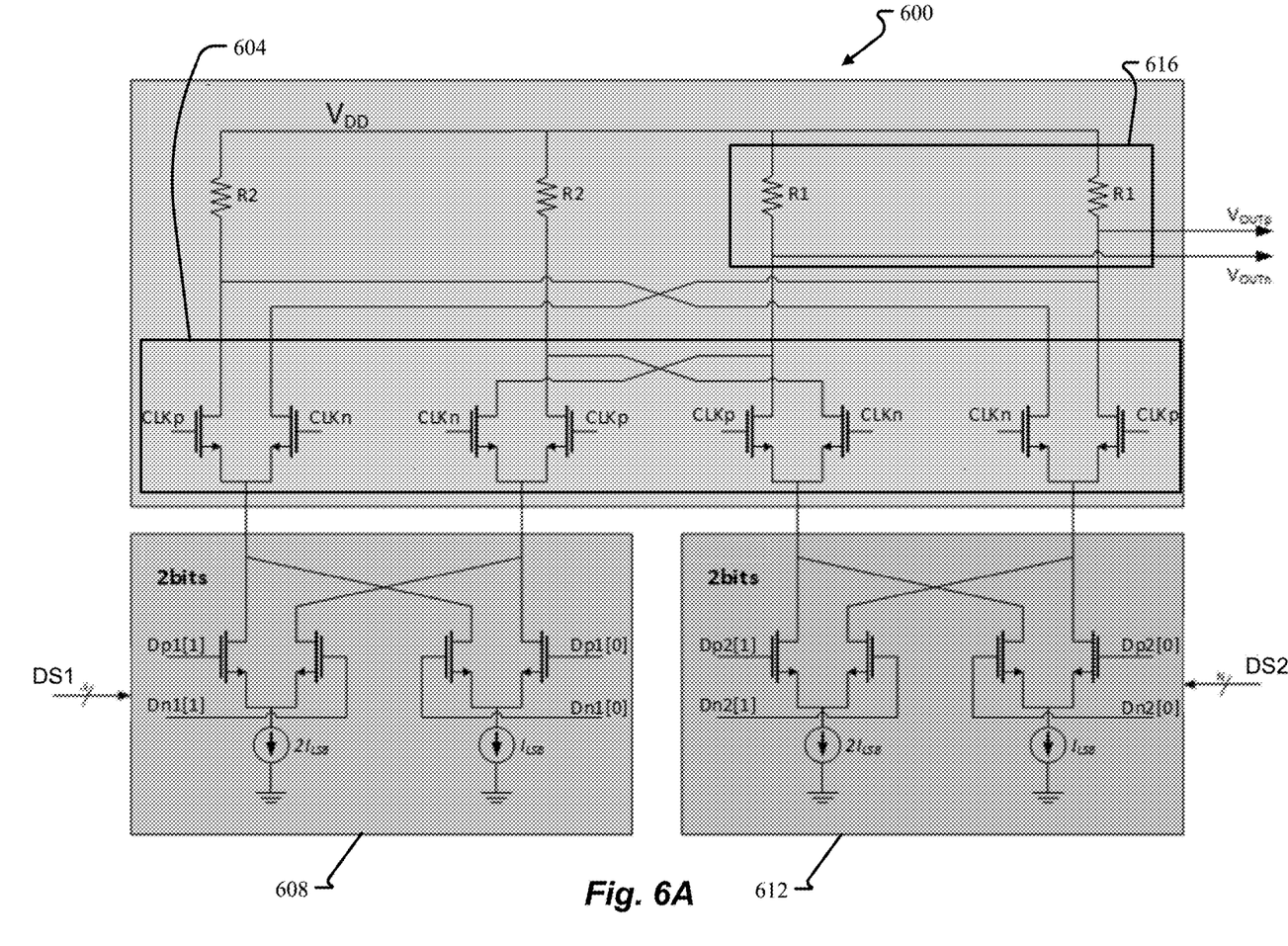
FIG. 6A illustrates a two-bit DAC implemented with current control according to at least one example embodiment.

FIG. 6A illustrates DAC 600 including a data modulator 604 implemented with current control according to at least one example embodiment. The DAC 600 implemented with current control may replace the above-described DAC(s) implemented with voltage control.

As shown in FIG. 6A, the data modulator 604 may be implemented with a multiplexer including a plurality of switches driven by clock signals CLKn and CLKp (which may correspond to $CLK_I$ in the description of previous figures), where clock signal CLKn is the inverse of clock signal CLKp. The DAC 600 further includes amplifier blocks 608 and 612 that receive data from respective data streams DA1 and DS2. The DAC 600 is a two-bit DAC so each amplifier block 608 and 612 includes two current sources $I_{LSB}$ and $2I_{LSB}$ with each current source being connected to two switches. Similar to the weighting discussed above for the amplifiers of the KDM-V 300, the current source $2I_{LSB}$ is connected to switches that receive MSBs and outputs twice the current as the current source $I_{LSB}$ that is connected to switches that receive LSBs. In the scenario where the input data is binary encoded, the signal output from each amplifier block 608 and 612 may have four possible states represented by current values $0I_{LSB}$, $I_{LSB}$, $2I_{LSB}$, or $3I_{LSB}$ because the DAC 600 is a two-bit DAC. Each current value is indicative of the four possible sates of the digital input data (e.g., 00=$0I_{LSB}$, 01=$I_{LSB}$, 10=$2I_{LSB}$, 11=$3I_{LSB}$).

The DAC 600 also includes a conversion circuit 616 that converts the signal output from the data modulator 604 to a differential voltage signal Voutp/Voutn as the analog signal output from the DAC 600.

Here, it should be appreciated that the above-described DAC 600 that uses current steering is a very high-speed design when the current sources are operated continuously (i.e., turning the current sources ON and OFF would slow the operation). Since the modulator 604 multiplexes each time only one of the current sources is connected to the output the other current source may turn off. In order to overcome this issue, the DAC 600 includes a dummy load that sinks or sources the current of the unused current source. The dummy load in FIG. 6 is represented by resistors R2, which ensure that the current sources remain active when not in use.

Figure 6B:
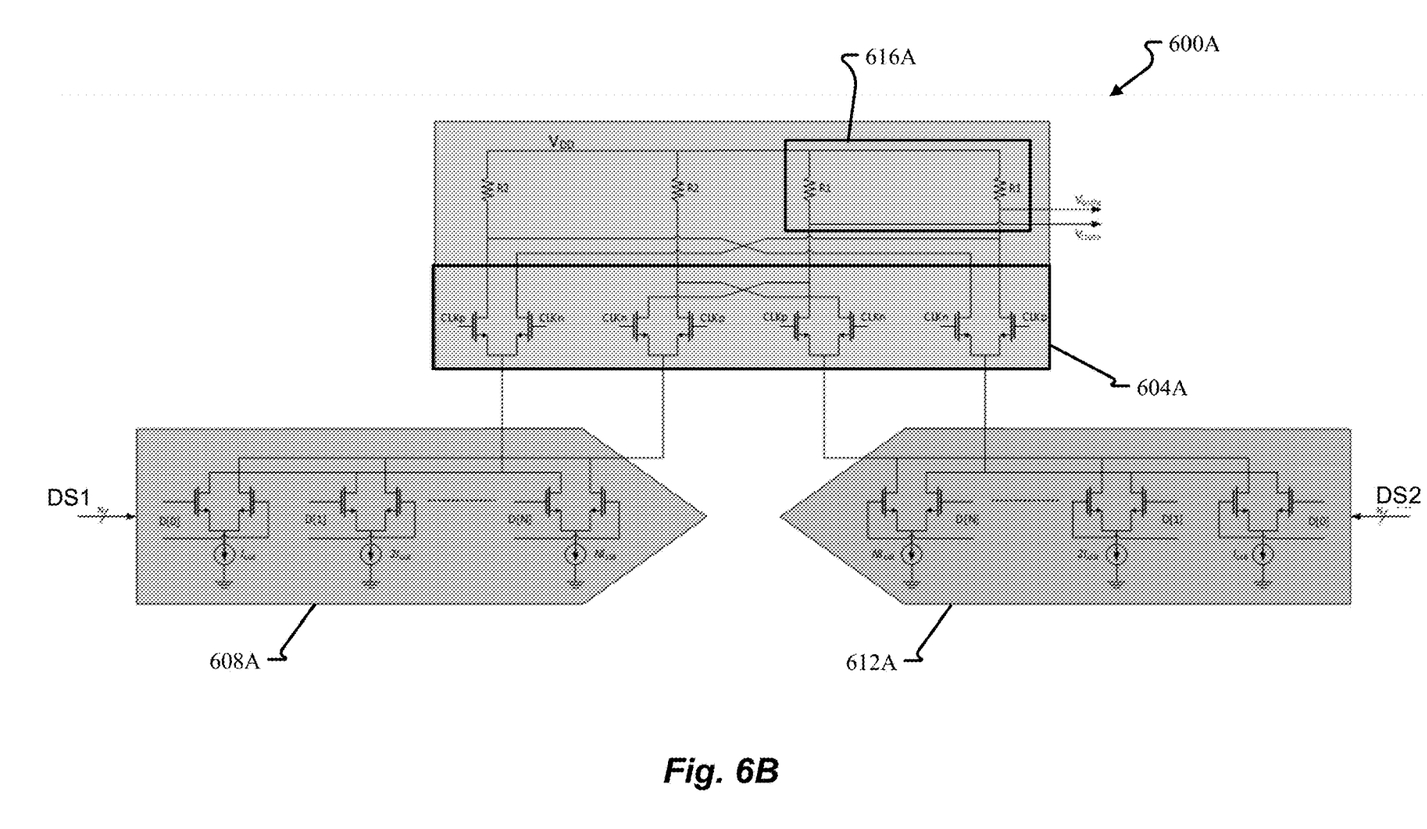
FIG. 6B illustrates an N-bit DAC implemented with current control according to at least one example embodiment.

FIG. 6B illustrates an N-bit DAC 600A including a modulator 604A implemented with current control according to at least one example embodiment. The modulator 604A and the conversion circuit 616A are substantially the same as modulator 604 and conversion circuit 616 in FIG. 6A. However, the amplifier blocks 608A and 612A are structured to handle N-bits of input data from data streams DS1 and DS2. Thus, each amplifier block 608A and 612A includes N sets of switches connected to N number of current sources. To achieve the same weighting as described above, each additional current source beyond the $2I_{LSB}$ current source outputs double the current of the immediately preceding current source. For example, for a three-bit DAC, the third current source in each amplifier 608A and 612A outputs a current with an amplitude that is four times $I_{LSB}$ or $4I_{LSB}$.

In view of the foregoing, it should be appreciated that inventive concepts relate to, among other things, a transmitter that uses an ultra-high-speed and low power data modulator that can be implemented in a SerDes system. Notably, there is no active device in the transmitter that operates at the full rate of output data. Rather, there is a specific combination and timing of low-rate data and clock multiplexing that generate the full rate data signal at the output of the KDM over a passive device, thereby reducing power consumption while still operating at high speeds.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

It should be appreciated that inventive concepts cover any embodiment in combination with any one or more other embodiment, any one or more of the features disclosed herein, any one or more of the features as substantially disclosed herein, any one or more of the features as substantially disclosed herein in combination with any one or more other features as substantially disclosed herein, any one of the aspects/features/embodiments in combination with any one or more other aspects/features/embodiments, use of any one or more of the embodiments or features as disclosed herein. It is to be appreciated that any feature described herein can be claimed in combination with any other feature(s) as described herein, regardless of whether the features come from the same described embodiment.

Example embodiments may be configured according to the following:

(1) A data modulator for a transmitter, the data modulator comprising:
 a multiplexer configured to:
 receive, at a first rate, a first data stream including a plurality of first symbols and a second data stream including a plurality of second symbols; and
 selectively output, based on a first clock signal, the plurality of first symbols and the plurality of second symbols to form a third data stream that achieves a second rate greater than the first rate for transmission of the third data stream by the transmitter.

(2) The data modulator of (1), wherein the second rate is at least twice the first rate.

(3) The data modulator of one or more of (1) to (2), wherein each symbol in the plurality of first symbols and each symbol in the plurality of second symbols spans a first amount of time, and wherein a period of the first clock signal spans a second amount of time greater than the first amount of time.

(4) The data modulator of one or more of (1) to (3), wherein the second amount of time is twice as long as the first amount of time.

(5) The data modulator of one or more of (1) to (4), wherein the multiplexer is configured to output a first subset of the plurality of first symbols during a first half of a period of the first clock signal, and output a second subset of the plurality of second symbols during a second half of the period of the first clock signal.

(6) The data modulator of one or more of (1) to (5), wherein the first subset of the plurality of first symbols includes first and second symbols, and wherein the second subset of the plurality of second symbols includes third and fourth symbols.

(7) The data modulator of one or more of (1) to (6), wherein first, second, third, and fourth symbols are arranged in that order in the third data stream output from the multiplexer.

(8) The data modulator of one or more of (1) to (7), wherein the multiplexer is implemented with voltage control.

(9) The data modulator of one or more of (1) to (8), wherein the multiplexer is implemented with current control.

(10) The data modulator of one or more of (1) to (9), wherein at least one of the first data stream and the second data stream is thermometer encoded.

(11) A digital to analog converter (DAC), comprising:
 a first amplifier block configured to receive a first bit and a second bit of a first data stream at a first rate and output first and second signals based on values of the first and second bits;
 a second amplifier block configured to receive a third bit and a fourth bit of a second data stream at the first rate and output third and fourth signals based on values of the third and fourth bits;
 a modulator configured to receive the first, second, third, and fourth signals, and selectively output, based on a first clock signal, symbols of the first, second, third, and fourth signals to form a third data stream having a second rate greater than the first rate; and
 a conversion circuit configured to receive the symbols of the third data stream and output an analog signal representative of the first data stream and the second data stream.

(12) The DAC of (11), wherein the first amplifier block includes a first amplifier configured to receive the first bit and output the first signal, and a second amplifier configured to receive the second bit and output the second signal, and wherein the second amplifier block includes a third amplifier configured to receive the third bit and output the third signal, and a fourth amplifier configured to receive the fourth bit and output the fourth signal.

(13) The DAC of one or more of (11) to (12), wherein the first bit is a less significant bit than the second bit in the first data stream, wherein the third bit is a less significant bit than the fourth bit in the second data stream, and wherein gains of the second and fourth amplifiers are at least double gains of the first and third amplifiers.

(14) The DAC of one or more of (11) to (13), wherein the modulator includes a first multiplexer block configured to receive the first and second signals and output symbols of the first and second signals according to the first clock signal, and a second multiplexer block configured to receive the third and fourth signals and output symbols of the third and fourth signals according to an inverse of the first clock signal.

(15) The DAC of one or more of (11) to (14), wherein the first multiplexer block includes a first output configured to output symbols of the first signal, and a second output configured to output symbols of the second signal, and wherein the second multiplexer block includes a first output configured to output symbols of the third signal, and a second output configured to output symbols of the fourth signal.

(16) The DAC of one or more of (11) to (15), wherein the first output of the first multiplexer block is connected to the first output of the second multiplexer block, and wherein the second output of the first multiplexer block is connected to the second output of the second multiplexer block.

(17) The DAC of one or more of (11) to (16), wherein the conversion circuit includes a voltage divider circuit connected to the first and second outputs of both of the first and second multiplexer blocks.

(18) A transmitter, comprising:
a parallel input serial output (PISO) device configured to receive parallel input data and output serialized data at a first rate;
a digital to analog (DAC) converter including:
a first amplifier block configured to receive first and second bits of a first data stream of the serialized data at the first rate and output first and second signals based on values of the first and second bits;
a second amplifier block configured to receive third and fourth bits of a second data stream of the serialized data at the first rate and output third and fourth signals based on values of the third and fourth bits, wherein the first, second, third and fourth bits of data are received by the first and second amplifier blocks according to a predetermined arrangement;
a modulator configured to receive the first, second, third, and fourth signals, and to selectively output, based on a first clock signal, symbols of the first, second, third, and fourth signals to form a third data stream having a second rate greater than the first rate; and
a conversion circuit configured to receive the symbols of the third data stream from the modulator and output an analog signal representative of the third data stream.

(19) The transmitter of claim 18, wherein the second rate is twice the first rate.

(20) The transmitter of claim 18, further comprising:
a first signal generator configured to apply the first clock signal to the modulator; and a second signal generator configured to apply a second clock signal to the PISO device.

What is claimed is:
1. A data modulator for a transmitter, the data modulator comprising:
a multiplexer configured to:
receive, at a first rate, a first data stream including a plurality of first symbols and a second data stream including a plurality of second symbols; and
selectively output, based on a first clock signal, the plurality of first symbols and the plurality of second symbols to form a third data stream that achieves a second rate greater than the first rate for transmission of the third data stream by the transmitter, wherein each symbol in the plurality of first symbols and each symbol in the plurality of second symbols spans a first amount of time, and wherein a period of the first clock signal spans a second amount of time greater than the first amount of time.

2. The data modulator of claim 1, wherein the second rate is at least twice the first rate.

3. The data modulator of claim 1, wherein the multiplexer is configured to output a first subset of the plurality of first symbols during a first half of the period of the first clock signal, and output a second subset of the plurality of second symbols during a second half of the period of the first clock signal.

4. The data modulator of claim 1, wherein the second amount of time is twice as long as the first amount of time.

5. The data modulator of claim 1, wherein the multiplexer is implemented with voltage control.

6. The data modulator of claim 1, wherein the multiplexer is implemented with current control.

7. The data modulator of claim 1, wherein at least one of the first data stream and the second data stream is thermometer encoded.

8. A data modulator for a transmitter, the data modulator comprising:
a multiplexer configured to:
receive, at a first rate, a first data stream including a plurality of first symbols and a second data stream including a plurality of second symbols; and
selectively output, based on a first clock signal, the plurality of first symbols and the plurality of second symbols to form a third data stream that achieves a second rate greater than the first rate for transmission of the third data stream by the transmitter,
wherein the multiplexer is configured to output a first subset of the plurality of first symbols during a first half of a period of the first clock signal, and output a second subset of the plurality of second symbols during a second half of the period of the first clock signal.

9. The data modulator of claim 8, wherein the first subset of the plurality of first symbols includes first and second symbols, and wherein the second subset of the plurality of second symbols includes third and fourth symbols.

10. The data modulator of claim 9, wherein first, second, third, and fourth symbols are arranged in that order in the third data stream output from the multiplexer.

11. A digital to analog converter (DAC), comprising:
a first amplifier block configured to receive a first bit and a second bit of a first data stream at a first rate and output first and second signals based on values of the first and second bits;

a second amplifier block configured to receive a third bit and a fourth bit of a second data stream at the first rate and output third and fourth signals based on values of the third and fourth bits;

a modulator configured to receive the first, second, third, and fourth signals, and selectively output, based on a first clock signal, symbols of the first, second, third, and fourth signals to form a third data stream having a second rate greater than the first rate; and a conversion circuit configured to receive the symbols of the third data stream and output an analog signal representative of the first data stream and the second data stream.

12. The DAC of claim 11, wherein the first amplifier block includes a first amplifier configured to receive the first bit and output the first signal, and a second amplifier configured to receive the second bit and output the second signal, and wherein the second amplifier block includes a third amplifier configured to receive the third bit and output the third signal, and a fourth amplifier configured to receive the fourth bit and output the fourth signal.

13. The DAC of claim 12, wherein the first bit is a less significant bit than the second bit in the first data stream, wherein the third bit is a less significant bit than the fourth bit in the second data stream, and wherein gains of the second and fourth amplifiers are at least double gains of the first and third amplifiers.

14. The DAC of claim 11, wherein the modulator includes a first multiplexer block configured to receive the first and second signals and output symbols of the first and second signals according to the first clock signal, and a second multiplexer block configured to receive the third and fourth signals and output symbols of the third and fourth signals according to an inverse of the first clock signal.

15. The DAC of claim 14, wherein the first multiplexer block includes a first output configured to output symbols of the first signal, and a second output configured to output symbols of the second signal, and wherein the second multiplexer block includes a first output configured to output symbols of the third signal, and a second output configured to output symbols of the fourth signal.

16. The DAC of claim 15, wherein the first output of the first multiplexer block is connected to the first output of the second multiplexer block, and wherein the second output of the first multiplexer block is connected to the second output of the second multiplexer block.

17. The DAC of claim 16, wherein the conversion circuit includes a voltage divider circuit connected to the first and second outputs of both of the first and second multiplexer blocks.

18. A transmitter, comprising:

a parallel input serial output (PISO) device configured to receive parallel input data and output serialized data at a first rate; and a digital to analog (DAC) converter including:

a first amplifier block configured to receive first and second bits of a first data stream of the serialized data at the first rate and output first and second signals based on values of the first and second bits;

a second amplifier block configured to receive third and fourth bits of a second data stream of the serialized data at the first rate and output third and fourth signals based on values of the third and fourth bits, wherein the first, second, third and fourth bits of data are received by the first and second amplifier blocks according to a predetermined arrangement;

a modulator configured to receive the first, second, third, and fourth signals, and to selectively output, based on a first clock signal, symbols of the first, second, third, and fourth signals to form a third data stream having a second rate greater than the first rate; and a conversion circuit configured to receive the symbols of the third data stream from the modulator and output an analog signal representative of the third data stream.

19. The transmitter of claim 18, wherein the second rate is twice the first rate.

20. The transmitter of claim 18, further comprising:

a first signal generator configured to apply the first clock signal to the modulator; and a second signal generator configured to apply a second clock signal to the PISO device.

* * * * *